(12) United States Patent
Nonogawa et al.

(10) Patent No.: US 9,343,618 B2
(45) Date of Patent: May 17, 2016

(54) METHOD OF MANUFACTURING LIGHT-EMITTING DEVICE

(71) Applicant: TOYODA GOSEI CO., LTD., Kiyosu-shi (JP)

(72) Inventors: Takashi Nonogawa, Kiyosu (JP); Takashi Terayama, Kiyosu (JP); Toshimasa Hayashi, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/179,426

(22) Filed: Feb. 12, 2014

(65) Prior Publication Data

US 2014/0295591 A1      Oct. 2, 2014

(30) Foreign Application Priority Data

Mar. 28, 2013   (JP) ................................. 2013-069493

(51) Int. Cl.
*H01L 21/00* (2006.01)
*H01L 33/00* (2010.01)
*H01L 33/50* (2010.01)

(52) U.S. Cl.
CPC ........... *H01L 33/0095* (2013.01); *H01L 33/508* (2013.01); *H01L 2933/0041* (2013.01)

(58) Field of Classification Search
CPC ....................................................... H01L 21/00
See application file for complete search history.

(56) References Cited

U.S. PATENT DOCUMENTS

| | | | |
|---|---|---|---|
| 2006/0097621 A1* | 5/2006 | Park et al. ..................... | 313/512 |
| 2008/0054279 A1 | 3/2008 | Hussell et al. | |
| 2009/0224273 A1 | 9/2009 | Sakamoto et al. | |
| 2010/0044735 A1* | 2/2010 | Oyamada .............. | H01L 33/504 257/98 |
| 2010/0320483 A1 | 12/2010 | Kadotani et al. | |
| 2013/0076230 A1* | 3/2013 | Watanabe ............. | H01L 33/501 313/498 |

FOREIGN PATENT DOCUMENTS

| | | |
|---|---|---|
| JP | 2007-273754 A | 10/2007 |
| JP | 2012-009905 A | 1/2012 |

* cited by examiner

*Primary Examiner* — Marvin Payen
(74) *Attorney, Agent, or Firm* — McGinn IP Law Group PLLC

(57) ABSTRACT

A method of manufacturing a light-emitting device includes providing a case including an annular sidewall and an LED chip including a chip substrate and a crystal layer and mounted in a region surrounded by the sidewall of the case, and dripping a droplet of an electrically-charged phosphor-containing resin so as to fill a space between the sidewall and the LED chip. The droplet is attracted toward the sidewall by an electrostatic force during the dripping.

15 Claims, 4 Drawing Sheets

METHOD OF MANUFACTURING LIGHT-EMITTING DEVICE

The present application is based on Japanese patent application No. 2013-069493 filed on Mar. 28, 2013, the entire contents of which are incorporated herein by reference.

BACKGROUND OF THE INVENTION

1. Field of the Invention

The invention relates to a method of manufacturing a light-emitting device.

2. Description of the Related Art

A light-emitting device is known in which a top portion of an LED chip is covered with a phosphor-containing resin (See e.g. JP-A-2012-009905). In the light-emitting device, color of light emitted from the LED chip to transmit through the resin is mixed with color of fluorescence light emitted from the phosphor in the resin. Thus, the mixed color is perceived as the emission color of the light-emitting device.

However, the light emitted from the LED chip and inputted to the phosphor-containing resin includes a component to be scattered and decayed by the phosphor as well as a component to transmit through the resin and a component to excite the phosphor.

Thus, if the top portion of the LED chip is covered with the phosphor-containing resin as in the light-emitting device disclosed in JP-A-2012-009905, the emitted light may be scattered in the phosphor-containing resin over the LED chip where the luminous flux is most concentrated. That is, the amount of luminous flux extracted from the light-emitting device may be significantly reduced due to the light scattering caused by the phosphor.

On the other hand, a light-emitting device is known in which the phosphor is not disposed over the LED chip where the luminous flux is most concentrated and an inorganic material such as glass containing phosphor is disposed on the side of the LED chip (See e.g. JP-A-2007-273754).

SUMMARY OF THE INVENTION

It is an object of the invention to provide a method of manufacturing a light-emitting device that the phosphor is disposed only on the side of the LED chip by dripping a phosphor-containing resin thereto so as to prevent the reduction in luminous flux due to the light scattering caused by the phosphor disposed over the LED chip.

(1) According to one embodiment of the invention, a method of manufacturing a light-emitting device comprises:

providing a case comprising an annular sidewall and an LED chip comprising a chip substrate and a crystal layer and mounted in a region surrounded by the sidewall of the case; and dripping a droplet of an electrically-charged phosphor-containing resin so as to fill a space between the sidewall and the LED chip, wherein the droplet is attracted toward the sidewall by an electrostatic force during the dripping.

In the above embodiment (1) of the invention, the following modifications and changes can be made.

(i) The phosphor-containing resin is not applied to an upper surface of the LED chip.

(ii) The phosphor-containing resin has a relative permittivity of not less than 3.

(iii) The droplet has a viscosity of not less than 5 Pa·s.

(iv) The droplet is dripped while the crystal layer is grounded.

Effects of the Invention

According to one embodiment of the invention, a method of manufacturing a light-emitting device can be provided that the phosphor is disposed only on the side of the LED chip by dripping a phosphor-containing resin thereto so as to prevent the reduction in luminous flux due to the light scattering caused by the phosphor disposed over the LED chip.

BRIEF DESCRIPTION OF THE DRAWINGS

Next, the present invention will be explained in more detail in conjunction with appended drawings, wherein.

DESCRIPTION OF THE PREFERRED EMBODIMENTS

Embodiment

Figure 1:
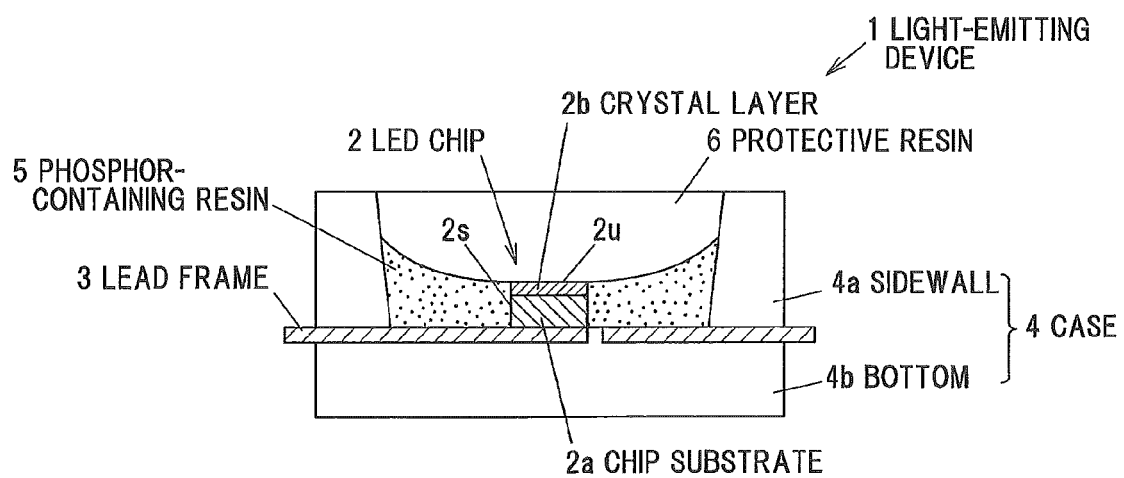
FIG. 1 is a vertical cross-sectional view showing a light-emitting device in an embodiment.

FIG. 1 is a vertical cross-sectional view showing a light-emitting device 1 in the embodiment. The light-emitting device 1 has a case 4 having a bottom 4b and an annular sidewall 4a, a lead frame 3 included in the case 4, an LED chip 2 mounted on the lead frame 3 in a region surrounded by the sidewall 4a in the case 4, a phosphor-containing resin 5 formed on lateral sides of the LED chip 2 in the region surrounded by the sidewall 4a in the case 4, and a protective resin 6 filling a portion above the LED chip 2 and above the phosphor-containing resin 5.

The LED chip 2 has a chip substrate 2a and a crystal layer 2b formed on the chip substrate 2a. The crystal layer 2b has a light-emitting layer and cladding layers sandwiching the light-emitting layer. The LED chip 2 may be either of a face-up type or face-down type. The LED chip 2 is connected to the lead frame 3 by wires or conductive bumps, etc.

The chip substrate 2a is, e.g., an insulating substrate such as sapphire substrate or a conductive substrate such as GaN substrate.

A conductive material such as Ag, Cu or Al is used to form the entire lead frame 3 or the surface thereof. Alternatively, for example, a substrate having a conductive pattern on a surface thereof may be used in place of the lead frame 3.

The case 4 is formed of, e.g., a thermoplastic resin such as polyphthalamide resin, LCP (Liquid Crystal Polymer) or PCT (Polycyclohexylene Dimethylene Terephthalate) or a thermosetting resin such as silicone resin, modified silicone resin, epoxy resin or modified epoxy resin, and is formed by injection molding. The case 4 may contain light-reflecting particles of titanium dioxide, etc., to improve light reflectance.

The phosphor-containing resin 5 is a resin containing particulate phosphors. The resin constituting the phosphor-containing resin 5 is, e.g., a silicone-based resin or an epoxy-based resin. The type of the phosphor is not limited. For example, when emission color of the LED chip 2 is blue and fluorescence color of the phosphor contained in the phosphor-containing resin 5 is yellow, emission color of the light-emitting device 1 is white.

The phosphor-containing resin 5 is mainly filled between the LED chip 2 and the sidewall 4a and is hardly applied to an upper surface 2u of the LED chip 2. Therefore, light scattering caused by phosphor hardly occurs in a portion above the LED chip 2 in which luminous flux of light emitted from the LED chip 2 is most concentrated and it is thus possible to effectively suppress reduction in luminous flux of the light-emitting device 1.

Particularly preferably, the phosphor-containing resin 5 is filled only between the LED chip 2 and the sidewall 4a and is not applied to the upper surface 2u of the LED chip 2, i.e., the phosphor-containing resin 5 is in contact with side surfaces 2s of the LED chip 2 but is not in contact with the upper surface 2u, in order to further effectively suppress reduction in luminous flux of the light-emitting device 1.

The protective resin 6 is formed of, e.g., a resin material such as silicone-based resins or epoxy-based resins, or glass. The protective resin 6 does not contain phosphor. Alternatively, the light-emitting device 1 may not have the protective resin 6.

Figure 2:
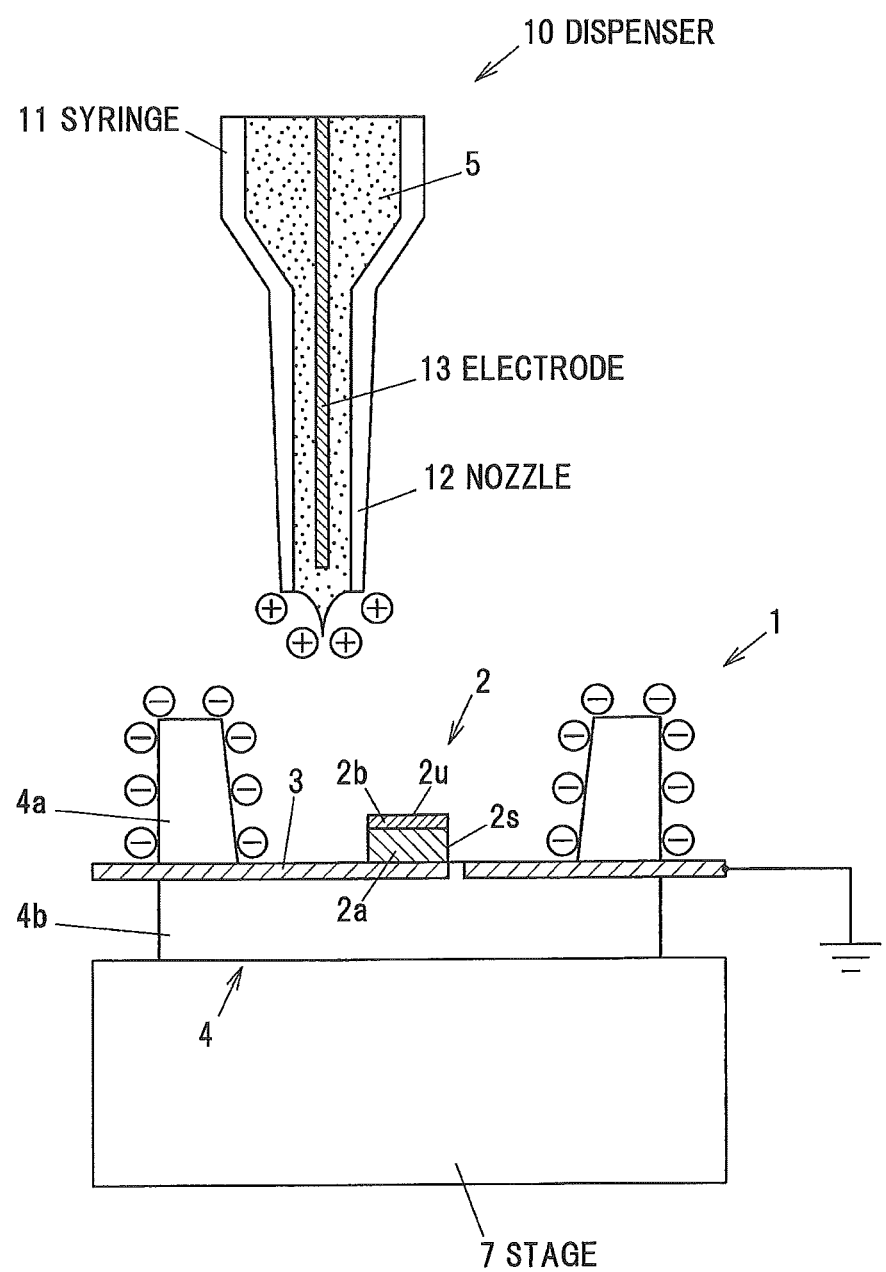
FIG. 2 is a vertical cross-sectional view showing the light-emitting device in the embodiment and a dispenser used for filling a phosphor-containing resin.

FIG. 2 is a vertical cross-sectional view showing the light-emitting device 1 in the embodiment and a dispenser 10 used for filling the phosphor-containing resin 5. The light-emitting device 1 is fixed to a stage 7 which is movable in a horizontal direction.

The dispenser 10 has a syringe 11 filled with the liquid phosphor-containing resin 5, a needle-like nozzle 12 provided at a tip of the syringe 11 and an electrode 13 provided in the nozzle 12.

The dispenser 10 can electrically charge the phosphor-containing resin 5 in the nozzle 12 using the electrode 13. The phosphor-containing resin 5 is positively charged when the case 4 is formed of a material which is likely to be negatively charged, and the phosphor-containing resin 5 is negatively charged when the case 4 is formed of a material which is likely to be positively charged.

At the time of dripping the electrically-charged phosphor-containing resin 5 into the case 4, air pressure in the syringe 11 is increased and the phosphor-containing resin 5 is then discharged from the nozzle 12. The phosphor-containing resin 5 discharged from the nozzle 12 and formed into droplets falls in the electrically-charged state toward the case 4.

Figure 3A:
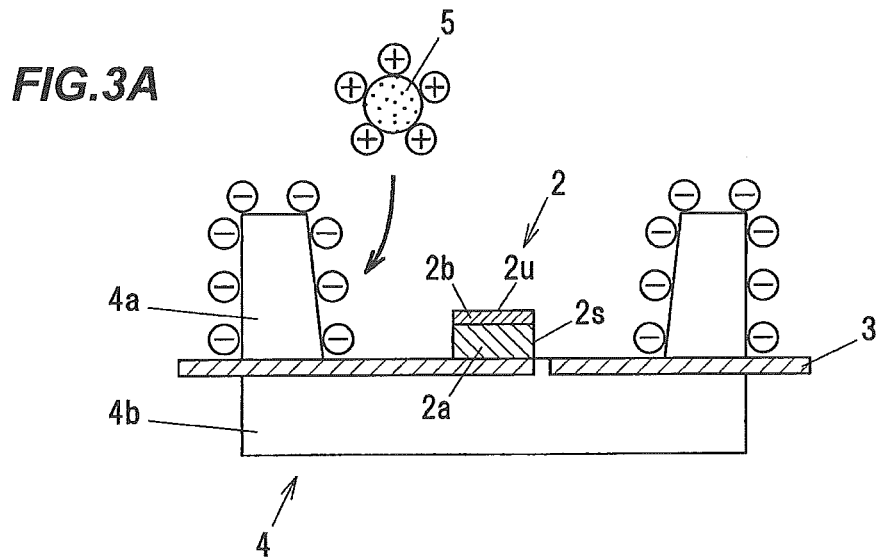
FIG. 3A to FIG. 3C are vertical cross-sectional views showing a state when filling the phosphor-containing resin into a case.
Figure 3B:
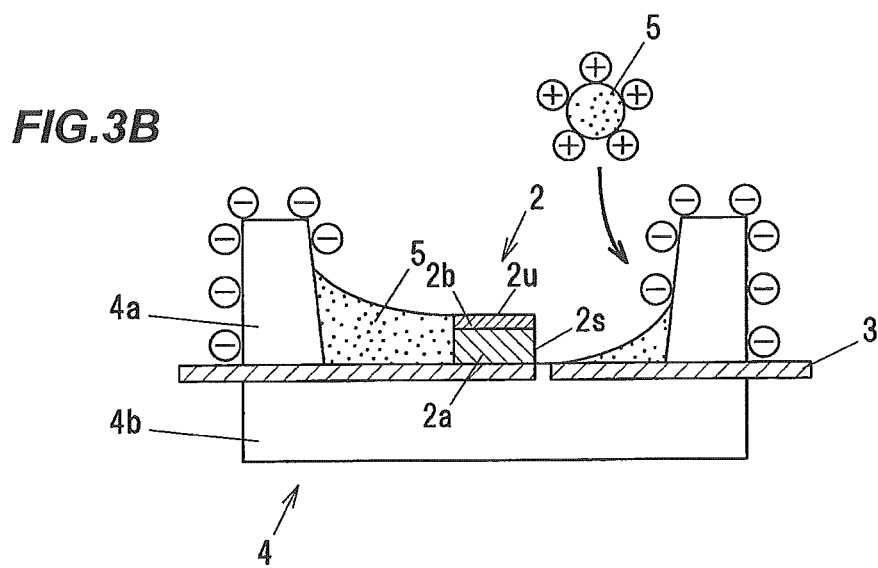
Figure 3C:
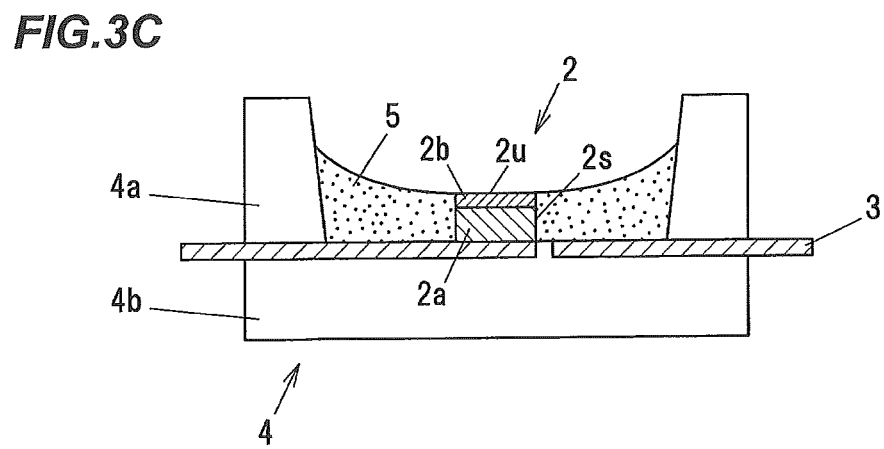

FIG. 3A to FIG. 3C are vertical cross-sectional views showing a state when filling the phosphor-containing resin 5 into the case 4.

As shown in FIG. 3A, a droplet of the phosphor-containing resin 5 discharged from the nozzle 12 falls down while being attracted toward the sidewall 4a due to an electrostatic force acting between the phosphor-containing resin 5 and the sidewall 4a of the case 4 which are charged oppositely.

Note that, in case that the lead frame 3 is exposed on a bottom surface of the bottom 4b of the case 4 and is in contact with the conductive stage 7, the stage 7 may be grounded.

In order to sufficiently electrically charge the phosphor-containing resin 5 so that a sufficient electrostatic force acts between the phosphor-containing resin 5 and the sidewall 4a, a relative permittivity of the phosphor-containing resin 5 is preferably not less than 10. However, an electrostatic force can act even at a relative permittivity of not less than 3 depending on the conditions.

In addition, in the present embodiment, since the droplets of the phosphor-containing resin 5 are attracted into the case 4 by the electrostatic force, a resin having a higher viscosity (e.g., not less than 5 Pa·s) than a resin used for typical drip molding (potting) can be used as the phosphor-containing resin 5. That is, the phosphor-containing resin 5 in the liquid form before curing as well as in the droplet form may have a viscosity of not less than 5 Pa·s. When the phosphor-containing resin 5 has high viscosity, deposition of phosphor contained in the phosphor-containing resin 5 is less likely to occur in the dispenser 10. Therefore, variation in the phosphor concentration in the dripped droplet is reduced and it is thus possible to suppress color unevenness among devices when plural light-emitting devices 1 are formed.

As shown in FIG. 3B, the phosphor-containing resin 5 is being filled in a region between the side surfaces 2s of the LED chip 2 and the sidewall 4a. At this time, it is preferable that the droplet of the phosphor-containing resin 5 be not dripped onto the upper surface 2u of the LED chip 2.

FIG. 3C shows a state in which the phosphor-containing resin 5 has been filled in the region between the side surfaces 2s of the LED chip 2 and the sidewall 4a. After this, the protective resin 6 for protecting the LED chip 2 and the phosphor-containing resin 5 may be formed thereon. The protective resin 6 is formed by typical drip molding without electrically charging a resin.

Luminous flux was measured on the light-emitting device 1 in the present embodiment and light-emitting devices in Comparative Examples and the comparison result is shown below as an example of evaluation of the light-emitting device 1 in the present embodiment.

A light-emitting device with phosphor dispersed in a sealing resin which seals an LED chip (Comparative Example 1) and a light-emitting device with phosphor settled on the bottom of the sealing resin (Comparative Example 2) were used as the light-emitting devices of Comparative Examples. Both Comparative Examples 1 and 2 are typical light-emitting devices with phosphor arranged above the LED chip and have a phosphor-containing resin at a position where the phosphor-containing resin 5 and the protective resin 6 would be located in the light-emitting device 1 of the present embodiment. Note that, the LED chip, the case and the lead frame in Comparative Examples 1 and 2 are configured in the same manner as the light-emitting device 1 in the present embodiment.

Each of the light-emitting device 1 in the present embodiment, Comparative Example 1 and Comparative Example 2 which were used for the measurement is a side-view type light-emitting device in which an opening of the case 4 is 0.80 mm×2.80 mm in size and a silicone resin containing YAG phosphor having an average grain size of 20 μm is filled as a phosphor-containing resin.

Figure 4:
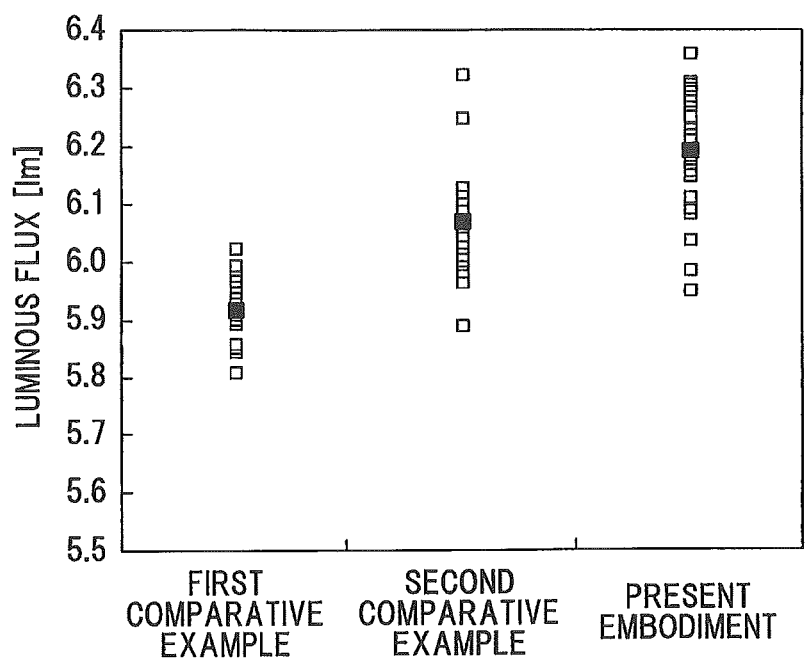
FIG. 4 is a graph showing measured values of luminous flux of the light-emitting device in the present embodiment and those of light-emitting devices in Comparative Examples.

FIG. 4 is a graph showing the measured values of luminous flux of the light-emitting device 1 in the present embodiment and those of the light-emitting devices in Comparative Examples. In the graph, the measured value of Comparative Example 1 is shown on the left side, that of Comparative Example 2 is shown in the middle and that of the light-emitting device 1 is shown on the right side.

FIG. 4 shows that the average luminous flux value of the light-emitting device 1 is about 5% greater than that of Comparative Example 1 and about 2% greater than that of Comparative Example 2.

Figure 5:
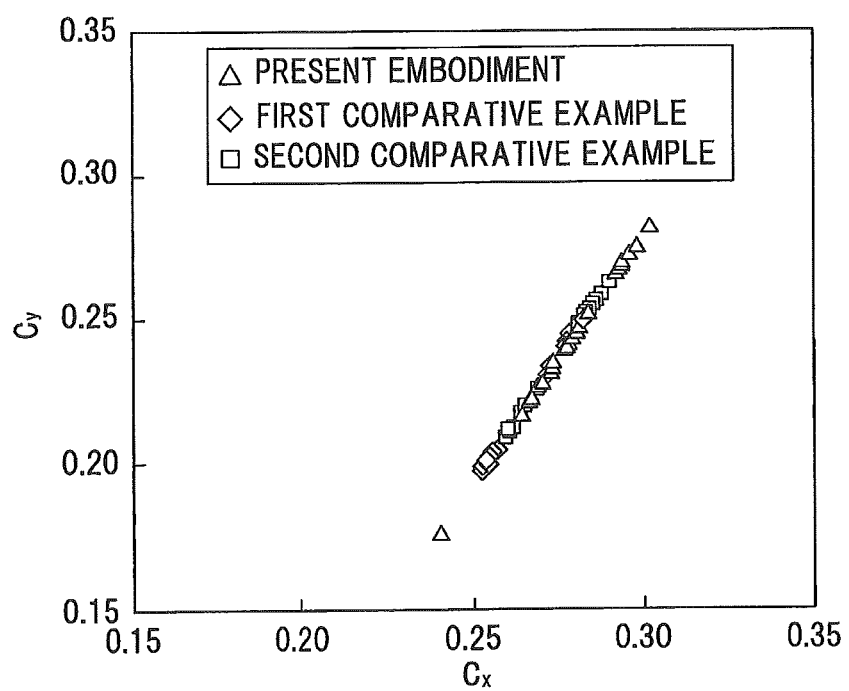
FIG. 5 is a diagram illustrating chromaticity of the light-emitting device in the present embodiment and the light-emitting devices in Comparative Examples.

FIG. 5 is a diagram illustrating chromaticity of the light-emitting device 1 in the present embodiment and the light-emitting devices in Comparative Examples. Horizontal and vertical axes in FIG. 5 respectively indicate chromaticity coordinates Cx and Cy. The chromaticity of the light-emitting device 1 in the present embodiment (marked by "Δ"), that of Comparative Example 1 (marked by "◇") and that of Comparative Example 2 (marked by "☐") are virtually on the same line and this indicates that difference in luminous flux shown in FIG. 4 is not caused by visual sensitivity.

Although the embodiment of the invention has been described, the invention is not intended to be limited to the embodiment and the various kinds of modifications can be implemented without departing from the gist of the invention.

In addition, the invention according to claims is not to be limited to the above-mentioned embodiment. Further, please note that all combinations of the features described in the embodiments are not necessary to solve the problem of the invention.

What is claimed is:

1. A method of manufacturing a light-emitting device, comprising:
   providing a case comprising:
      an annular sidewall; and
      a light-emitting diode (LED) chip, the LED chip comprising:
         a chip substrate; and
         a crystal layer, the LED chip being mounted in a region surrounded by the sidewall of the case;
   dripping a droplet of an electrically-charged phosphor-containing resin so as to fill a space between the sidewall and the LED chip; and
   forming a protective resin layer so as to fill a space between the phosphor-containing resin and an upper edge of the sidewall, the protective resin layer not including a phosphor,
   wherein the droplet is attracted toward the sidewall by an electrostatic force during the dripping, and
   wherein the phosphor-containing resin is not applied to an upper surface of the LED chip.

2. The method according to claim 1, wherein the phosphor-containing resin has a relative permittivity of not less than 3.

3. The method according to claim 1, wherein the droplet has a viscosity of not less than 5 Pas.

4. The method according to claim 1, wherein the droplet is dripped while the crystal layer is grounded.

5. The method according to claim 1, further comprising:
   charging the electrically-charged phosphor-containing resin to have a first charge; and
   charging the case to have a second charge, the first charge being opposite to the second charge.

6. A method of manufacturing a light-emitting device, comprising:
   providing a case comprising:
      an annular sidewall; and
      a light-emitting diode (LED) chip, the LED chip comprising:
         a chip substrate; and
         a crystal layer, the LED chip being mounted in a region surrounded by the sidewall of the case; and
   dripping a droplet of an electrically-charged phosphor-containing resin so as to fill a space between the sidewall and the LED chip,
   wherein the droplet is attracted toward the sidewall by an electrostatic force during the dripping,
   wherein the electrically-charged phosphor-containing resin formed only on a side of the LED chip,
   wherein at an interface between the region and the side of the LED chip, a height of the resin is substantially equal to a height of the LED chip, and
   wherein at an interface between the sidewall and the resin, a height of the resin is greater than a height of the resin at the interface between the resin and the LED chip.

7. The method according to claim 5, wherein the phosphor-containing resin has a relative permittivity of not less than 3.

8. The method according to claim 5, wherein the droplet has a viscosity of not less than 5 Pas.

9. The method according to claim 5, wherein the droplet is dripped while the crystal layer is grounded.

10. The method according to claim 5, wherein the electrically-charged phosphor-containing resin has a first charge and the case has a second charge, the first charge being opposite to the second charge.

11. A method of manufacturing a light-emitting device, comprising:
    providing a case comprising:
       an annular sidewall; and
       a light-emitting diode (LED) chip, the LED chip comprising:
          a chip substrate; and
          a crystal layer, the LED chip being mounted in a region surrounded by the sidewall of the case;
    dripping a droplet of an electrically-charged phosphor-containing resin so as to only fill a space between an upper edge of the sidewall and the LED chip; and
    forming a protective resin layer so as to fill a space between the phosphor-containing resin and an upper edge of the sidewall, the protective resin layer not including a phosphor,
    wherein the droplet is attracted toward the sidewall by an electrostatic force during the dripping.

12. The method according to claim 11, wherein the phosphor-containing resin has a relative permittivity of not less than 3.

13. The method according to claim 11, wherein the droplet has a viscosity of not less than 5 Pas.

14. The method according to claim 11, wherein the droplet is dripped while the crystal layer is grounded.

15. The method according to claim 11, wherein the electrically-charged phosphor-containing resin has a first charge and the case has a second charge, the first charge being opposite to the second charge.

* * * * *